United States Patent
Benz et al.

(10) Patent No.: US 7,305,225 B2
(45) Date of Patent: Dec. 4, 2007

(54) RADIO SIGNAL RECEIVER

(75) Inventors: Christoph Benz, Ohlsbach (DE); Stefan Gierl, Karlsruhe (DE); Andreas Koerner, Karlsruhe (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 752 days.

(21) Appl. No.: 10/191,969

(22) Filed: Jul. 9, 2002

(65) Prior Publication Data
US 2003/0050023 A1    Mar. 13, 2003

(30) Foreign Application Priority Data
Jul. 10, 2001    (DE)    ................ 101 33 481

(51) Int. Cl.
*H04B 1/06*    (2006.01)
*H05K 11/00*    (2006.01)
(52) U.S. Cl. .................... 455/345; 455/161.2
(58) Field of Classification Search ........... 455/3.06, 455/150.1, 130, 160.1, 161.1, 162.1, 170.1, 455/345, 574, 161.2, 344; 340/426.28; 381/2
See application file for complete search history.

(56) References Cited

U.S. PATENT DOCUMENTS

| | | | | |
|---|---|---|---|---|
| 3,940,702 A | * | 2/1976 | Yoshimura et al. | 455/180.2 |
| 4,218,717 A | | 8/1980 | Shuster | 361/79 |
| 4,860,380 A | * | 8/1989 | Mengel | 455/186.2 |
| 4,902,956 A | * | 2/1990 | Sloan | 320/135 |
| 6,711,390 B1 | * | 3/2004 | Moers | 455/186.1 |
| 2002/0138180 A1 | * | 9/2002 | Hessing et al. | 701/1 |

FOREIGN PATENT DOCUMENTS

| | | |
|---|---|---|
| DE | 3511213 | 10/1986 |
| DE | 37 21 726 | 7/1987 |
| DE | 39 26 984 | 8/1989 |

(Continued)

*Primary Examiner*—Lewis West
(74) *Attorney, Agent, or Firm*—O'Shea, Getz & Kosakowski, P.C.

(57) ABSTRACT

A motor vehicle entertainment system includes a radio receiver and a control unit. The control unit receives a first status signal indicative of whether or not a motor vehicle door has been unlocked and initiates the application of power to the radio receiver upon the first status signal indicating that the door has been unlocked. Upon the application of power to the radio receiver, the radio receiver scans through a selected frequency spectrum to identify valid frequencies and their associated broadcast identifying information and stores a list of the valid frequencies and their associated broadcast identifying information in a memory device associated with the radio receiver. The radio receiver acquires and records information on a plurality of transmitters initially in a standby mode before it switches over to an operating mode. The radio receiver has a device for receiving an ON command from the user and switches from the standby mode to the operating mode when the ON command is received. The radio receiver may begin to operate before the ON command is input by the user, and independently of this input. If the radio receiver begins to operate in sufficient time before input of the ON command, then collection of transmitter information by the radio receiver may already be complete before the user inputs the ON command, which is typically indicative of the desire of the user to listen to an audio signal.

11 Claims, 2 Drawing Sheets

FOREIGN PATENT DOCUMENTS

| | | |
|---|---|---|
| DE | 40 17 756 | 6/1990 |
| DE | 197 25 898 | 6/1997 |
| DE | 197 30 050 | 7/1997 |
| DE | 197 53 715 | 12/1997 |
| DE | 19749536 | 5/1999 |
| EP | 0459360 | 12/1991 |
| EP | 0921637 | 6/1999 |
| JP | 62248191 | 4/1986 |
| JP | 2001004383 | 6/1999 |

\* cited by examiner

RADIO SIGNAL RECEIVER

BACKGROUND OF THE INVENTION

The present invention relates to the field of radio receivers, and in particular to the field of motor vehicle radio receivers.

Radio receivers with so-called Autobest functionality have been know for some time. These receivers, which are mainly used for car radios, automatically seek another frequency of the same transmitter and tune to this frequency when the reception quality of a transmitter to which they are tuned falls below a certain limit. Even when a driver travels over large distances, which exceed the range of an individual broadcast station, he is thus able to continue listening to a transmitter without having to manually seek an alternative frequency when reception on the presently set frequency becomes unsatisfactory.

However, these receivers do not provide uninterrupted listening since the process of seeking a frequency of the same transmitter can take considerable time, within which the receiver repeatedly tunes to other frequencies and checks whether the transmitter received there is identical to the original one. If such an interruption automatically occurs during a transmission of radio reports, such as warnings of a traffic jam, this is extremely annoying for the listener even if the interruption takes only a few seeks.

In order for the transmitter with the best reception quality of multiple selectable transmitters to be tuned in, it is advantageous for the radio receiver to have available as much information as possible about the entire reception band. In the case of conventional Autobest receivers, operation is occasionally interrupted in the operating mode for this purpose in order, in the standby mode, to examine another frequency of the reception band to determine if, and at what quality level, a transmitter is receivable at this frequency, and what its identity is. The scanning of the entire FM frequency band for this purpose takes place over a time span of several seconds. An interruption of the audio signal output of this length tends to be unpleasant for a listener. For this reason, the conventional Autobest receiver only switches from the operating mode to the standby mode occasionally to determine if, and at what quality level, a transmitter is receivable at this frequency and what its identity is, and then records this information. It is self-evident that this approach to scanning the entire reception band takes several minutes.

To ensure that the Autobest functionality is quickly available after switching on the receiver, a known approach is to record the information collected about the frequency band and transmitters included in this band in a non-volatile memory so when the receiver is switched off, the stored information is immediately available when the receiver is switched on again.

This solution is not completely satisfactory for a number of reasons. First, non-volatile memories are relatively expensive, and for this reason the memory capacity is not provided that would be necessary to store information on all transmitters receivable in the frequency band. Only information on the most recently heard transmitter is stored. The result is that, when the user tunes in a new transmitter shortly after switching on the receiver, there is a considerable risk that information on the alternative frequencies for this new transmitter has not been stored, and this information must therefore be collected again. Since the receiver does not "know" in advance where to find alternative frequencies for the new transmitter, it must scan the entire reception band to find the alternative frequencies.

While this disadvantage may be eliminated by the generous use of non-volatile memory for the transmitter information, another disadvantage with the conventional approach can not be so easily avoided. If the receiver is switched off at a first location, then moved and switched on again at a second location, the stored transmitter information at the time it is switched on relates to the transmitter region at the first location, which may be completely different from that at the second location. In this case, the complete set of transmitter information must again be collected after the receiver is switched on before reception optimization is possible.

Therefore, there is a need for an improved technique for automatically determining alternative frequencies that transmitters are available on.

SUMMARY OF THE INVENTION

A motor vehicle entertainment system includes a radio receiver and a control unit. The control unit receives a first status signal indicative of whether or not a motor vehicle door has been unlocked and initiates the application of power to the radio receiver upon the first status signal indicating that the door has been unlocked. Upon the application of power to the radio receiver, the radio receiver scans through a selected frequency spectrum to identify valid frequencies and their associated broadcast identifying information and stores a list of the valid frequencies and their associated broadcast identifying information programs in a memory device associated with the radio receiver.

The memory device is preferably volatile memory due its reduced relative cost. The radio receiver acquires and records information on a plurality of transmitters initially in the standby mode before it switches over to the operating mode. In the standby mode the receiver is unable to supply an output signal to a reproducer for outputting the audio signal immediately after being switched on, nevertheless, this does not involve a reduction in listener comfort for a user of the receiver in an appropriate system—as the following will make clear.

In a preferred embodiment, the radio receiver has a device for receiving an ON command from the user and is set up to switch over from the standby mode to the operating mode when the ON command is received. The radio receiver may begin to operate before the ON command is input by the user, and independently of this input. If the first action occurs in sufficient time before input of the ON command, collection of transmitter information by the radio receiver has already been completed before the user inputs the ON command to listen to an audio signal.

When the user for example actuates a button which to him appears to be the radio receiver ON-OFF switch, this action does not switch the radio receiver on—this has already occurred earlier—but merely causes the radio receiver to switch over from the standby mode to the operating mode. Subsequent actuation of the same button may result in a return to the standby mode.

According to another aspect of the invention, the above-defined radio receiver is part of a system together with a control unit which is coupled to at least one sensor, and is set up to switch the receiver on and/or off depending on the detection result of the at least one sensor. A sensor of this type may be provided to detect any parameter indicating an increased probability that a user will attempt to input the ON command. A sensor of this type may, for example, have the function of detecting the approach of a user, such that the control unit automatically switches the radio receiver on when the approach of a user is detected.

A system comprising a radio receiver and control unit installed in a motor vehicle may, for example, be coupled to the status of the door lock of the motor vehicle and detect the approach of a user when the door lock is unlocked. When the user unlocks the vehicle door, the control unit automatically switches the radio receiver on, and the radio receiver begins in its standby mode to scan the reception frequency band. Therefore, by the time the user inputs the ON command after sitting down in the vehicle, the scan may have been completed.

While the use of a sensor coupled to the status of the door lock is especially advantageous in that it enables detection of the user's approach at an early stage, the use of a variety of other sensor types may also be used, such as, for example: a sensor coupled to the seatbelt buckle to detect when the seat belt has been fastened by the user, a weight sensor installed in the driver's seat to detect a person sitting down in the driver's seat, etc.

Since unlocking the door does not necessarily indicate that a person will in fact sit down in the vehicle and switch on the radio receiver, it is useful to provide a second sensor to detect starting of the motor vehicle engine. This sensor enables the control unit to turn-off the radio receiver when a predetermined time span has expired after detection of the person's approach. That is, the radio receiver will be turned off if the vehicle has not been started within a predetermined time period after detecting the person's approach (e.g., unlocking their car).

Signal sources other than the radio receiver such as a CD player, cassette tape recorder, or even a hands-free system for a car phone may also be connected to the reproducer. When the reproducer receives signals from one of these sources, it is not necessary for the radio receiver to remain in the operating mode. However, in order to keep the collected transmitter information up to date, the radio receiver is not turned off by the control unit in this case but is put in the standby mode in order to detect and record transmitter information. In this case, it is not necessary to constantly scan the frequency band—it is sufficient instead to repeat the scan at two intervals separated by several minutes.

The radio receiver and the components of the control unit system may be connected by a network such as a MOST network. When such a network starts up, an initialization requiring several seconds may be required before the full transmissibility of the network is available. Transmission over the network may be required for transmission of the output signal from the radio receiver to the reproducer. When the switching on of the radio receiver is coupled to that of the network, this time period may also be utilized to implement the scan of the frequency band so that the required transmitter information is available as soon as the network is completely initialized.

These and other objects, features and advantages of the present invention will become apparent in light of the following detailed description of preferred embodiments thereof, as illustrated in the accompanying drawings.

DETAILED DESCRIPTION OF THE INVENTION

Figure 1:
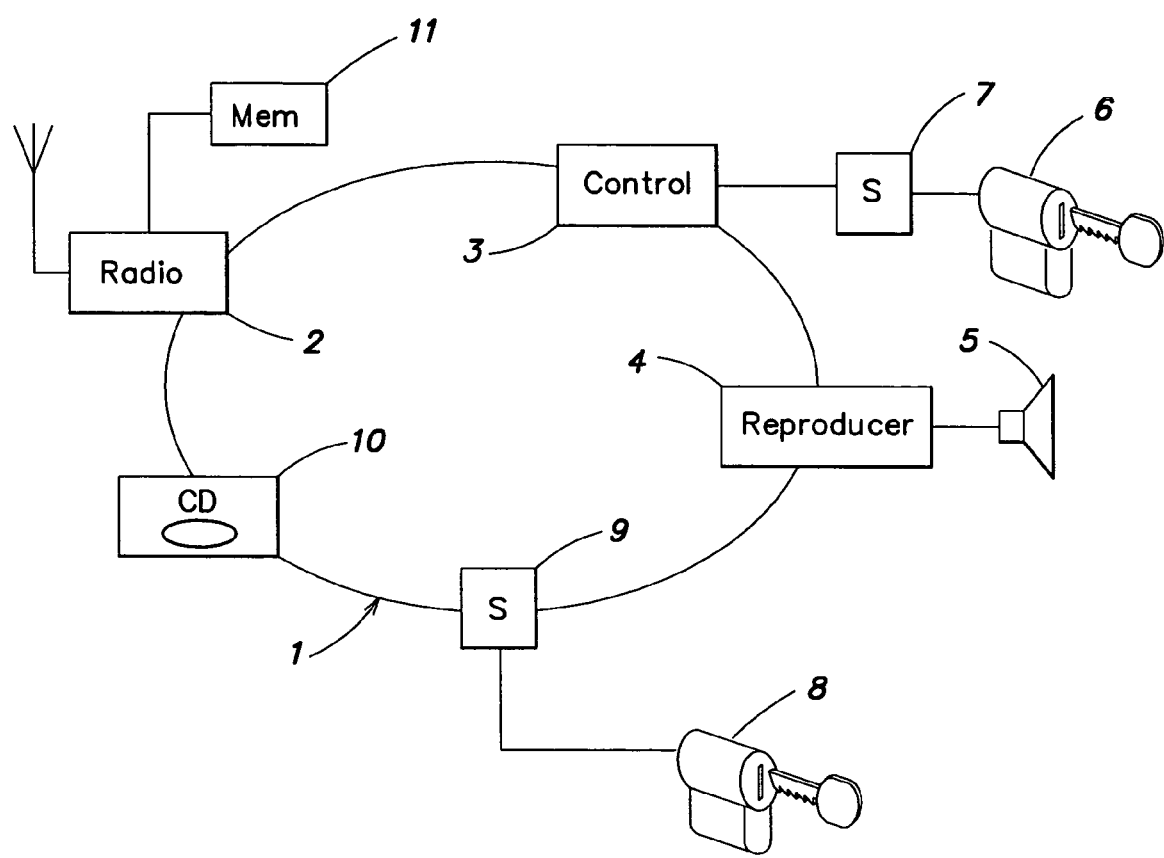
FIG. 1 is a block diagram illustration of a MOST network as an example of a system including a radio receiver and a control unit.

FIG. 1 is a block diagram of a MOST network with a plurality of units connected through a ring circuit 1. These units includes a radio receiver 2, a control unit 3, and a reproducer 4 which receives an output signal from the radio receiver 2 through the ring circuit 1 and outputs it as an audio signal through a speaker 5. The units also include a first sensor 7 (e.g., a switch) that is coupled to a door lock 6 and provides a signal to the control unit 3, and a second sensor 9 (e.g., a switch) that is coupled to an ignition lock 8 and communicates through the ring circuit 1 with the control unit 3. The units may also include a CD player 10. The control unit 3 is equipped with control elements and operates as a user interface.

The entire system is installed in a motor vehicle. The radio receiver 2 includes a volatile memory 11 that is provided to record transmitter information.

When the vehicle is turned off, the radio receiver 2, the control unit 3, and the reproducer 4 are de-energized, and the memory 11 contains no valid data.

Figure 2:
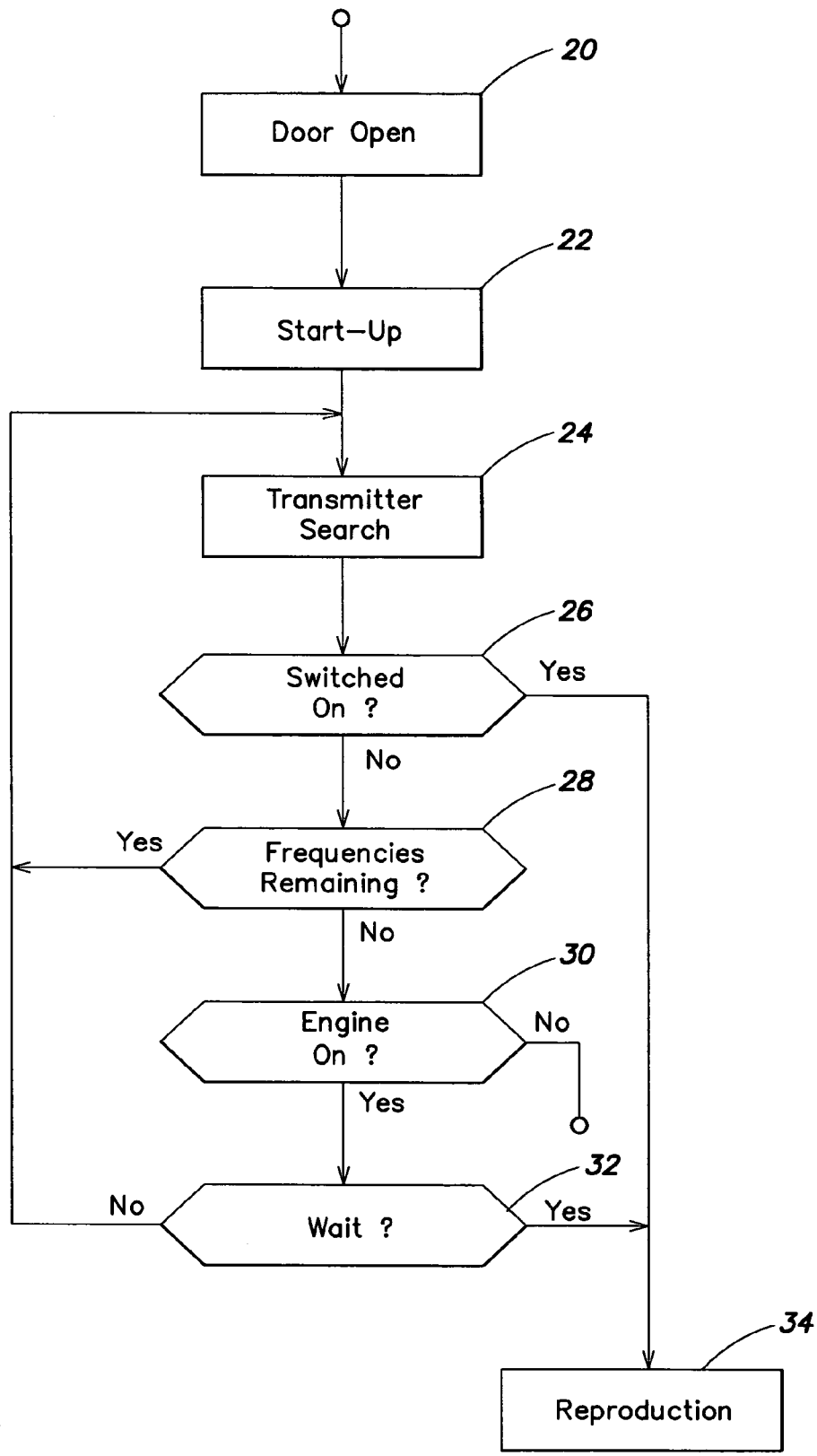
FIG. 2 is a flowchart illustration of an operating procedure implemented by the control unit and the radio receiver.

Referring to FIGS. 1 and 2, when a user unlocks the door lock 6 in step 20 (FIG. 2), the switch 7 closes and the control unit 3 is supplied with current. In step 22 the control unit then switches on the radio receiver 2 by switching on its power supply. The radio receiver 2 initially goes into the standby mode initiating a transmitter search in step 24 in which it first tunes to a predetermined initial frequency and checks whether a transmitter is receivable on this frequency and, if so, what the identity represented by the PI code is, and what its reception field strength is. If a transmitter is receivable, the associated parameters are recorded in the memory 11 (FIG. 1). In the meantime, step 26 checks to determine if a user has already input a command through the control unit 3 to switch on the radio receiver 2. In general, this will not be the case immediately after the radio receiver 2 is switched on since the user needs a few seconds after unlocking the door lock 6 to sit down in the vehicle, and to input through the control unit 3 an ON command to initiate the output of an output signal supplied by the radio receiver 2. The radio receiver 2 thus initially proceeds to step 28 to determine whether any frequencies are left in the frequency band of the radio receiver that have not yet been checked. If so, the receiver selects one of these frequencies and returns to step 24. If not, the scan of the frequency band is complete, and a complete set of transmitter information is stored in memory 11, which enables the radio receiver 2 to select the optimum reception frequency for the transmitter that the user has tuned the radio to.

If it is determined in step 26 or during wait step 32 that the user has input an ON command, the radio receiver switches to the operating mode in step 34 in which the radio receiver provides an output signal to the reproducer 4 (FIG. 1).

At a point in time which generally lies after the scan of the frequency band by the radio receiver 2, the control unit 3 checks the position of the ignition lock 8 as determined by a second sensor 9. If this indicates that the engine has been started, or that at a minimum the ignition key is in the ignition and has been rotated one click further, the radio receiver 2 remains on. Otherwise, it is assumed that the radio receiver 2 is no longer needed, and the control unit 3 switches the radio receiver 2 off by interrupting its supply of current; as a result, the data collected in the memory 11 are also lost. This ensures that when the vehicle is turned off for an extended period with the door unlocked, the radio receiver 2 does not continue to consume power unnecessarily and drain the vehicle battery.

When step 30 indicates that the engine has been started or that the ignition key has been turned, the radio receiver 2 (FIG. 1) remains on and switches to the wait state 32. If the user does not input a command to the control unit 3 to switch on the radio receiver 2, processing returns to step 24 after a predetermined time span of (e.g., 15 minutes), and the scan of the frequency band is repeated. This approach keeps the transmitter data in the memory 11 up to date when the vehicle is moving even when the user is not listening to the radio. As soon as the user gives the command to switch on the radio receiver 2, the radio receiver 2 switches to the operating mode in which it supplies an output signal, which is obtained from a radio signal received at a tuned reception frequency through the ring circuit 1 to the reproducer 4.

Even after the radio receiver 2 has switched to the operating mode, it automatically changes from time-to-time to the standby mode for short time spans in order to identify any receivable transmitters, and to measure and record the reception field strength for the specific individual reception frequencies different from the reception frequency tuned to. Since this action corresponds to the conventional operation of an Autobest receiver, a detailed description of the process is not required.

A number of modifications to the above method are possible. For example, opening the door is simply one of many events detectable in a vehicle which may initiate a scan of the frequency band and a collection of transmitter information. One conceivable approach would also be, for example, to detect the insertion or turning of the ignition key instead of the opening of the door. In this case as well, a short time span is usually still available between the detected event and the input of an ON command by a user, during which time at least part of the frequency band may be scanned.

Another approach is to carry out the above-described step S4 not during the in-progress scan of the frequency band but only after this has been completed, that is, between steps 28 and 30 in FIG. 2. This would have the following result: if the user gives the command to switch on the radio receiver 2 before the radio receiver 2 has completed the scan, the command is ignored, and the reproducer 4 remains silent until the scan is complete.

If the user inputs a command to the control unit 3 to turn off the radio receiver 2, this does not cause the control unit 3 to interrupt completely the supply of current to the radio receiver 2 but only to return the radio receiver 2 to the standby mode.

The same occurs when the output unit 4 receives a signal not from the radio receiver 2, but rather from the CD player 10, or another appropriate source not shown.

Although the present invention has been shown and described with respect to several preferred embodiments thereof, various changes, omissions and additions to the form and detail thereof, may be made therein, without departing from the spirit and scope of the invention.

What is claimed is:

1. A motor vehicle entertainment system, comprising:
   a radio receiver comprising a memory device; and
   a control unit that receives a first status signal indicative of whether or not a motor vehicle door has been unlocked and initiates the application of power to the radio receiver upon the first status signal indicating that the door has been unlocked;
   where upon the application of power to the radio receiver, the radio receiver scans through a selected frequency spectrum to identify valid frequencies and their associated broadcast identifying information and stores a list of the valid frequencies and their associated broadcast identifying information in the memory device.

2. The motor vehicle entertainment system of claim 1, where the control unit also receives a second status signal indicative of whether or not the motor vehicle engine is running, and turns-off power to the radio receiver if the second status signal fails to indicate that the motor vehicle engine is running within a certain period of time following the indication by the first status signal that the motor vehicle has been unlocked.

3. The motor vehicle entertainment system of claim 1, where the radio receiver and the control unit are connected to a MOST bus.

4. A motor vehicle entertainment system, comprising:
   a radio receiver;
   a memory device; and
   a control unit that receives a first status signal indicative of whether or not a key has been inserted into the ignition of the motor vehicle and initiates the application of power to the radio receiver upon the first status signal indicating that the key has been inserted into the ignition;
   where upon the application of power to the radio receiver, the radio receiver scans through a selected frequency spectrum to identify valid frequencies and their associated broadcast identifying information and stores a list of the valid frequencies and their associated broadcast identifying information in the memory device.

5. The motor vehicle entertainment system of claim 4, where the control unit also receives a second status signal indicative of whether or not the motor vehicle engine is running, and turns-off power to the radio receiver if the second status signal fails to indicate that the motor vehicle engine is running within a certain period of time following the indication by the first status signal that the key has been inserted into the ignition.

6. The motor vehicle entertainment system of claim 5, where the radio receiver and the control unit are connected to a MOST bus.

7. A motor vehicle entertainment system, comprising:
   a radio receiver;
   a memory device; and
   a control unit that receives a first status signal indicative of the presence of a motor vehicle operator and initiates the application of power to the radio receiver upon the first status signal indicating the presence of the operator;
   where upon the application of power to the radio receiver, the radio receiver scans through a selected frequency spectrum to identify valid frequencies and their associated broadcast identifying information and stores a list of the valid frequencies and their associated broadcast identifying information in the memory device.

8. The motor vehicle entertainment system of claim 7, where the control unit also receives a second status signal indicative of whether or not the motor vehicle engine is running, and turns-off power to the radio receiver if the second status signal fails to indicate that the motor vehicle engine is running within a certain period of time following the indication by the first status signal of the presence of the motor vehicle operator.

9. The motor vehicle entertainment system of claim 8, where the radio receiver and control unit communicate over a bus.

10. A method of initializing a motor vehicle radio receiver, comprising:

upon the application of power to the radio receiver, scanning through a selected frequency spectrum to identify valid frequencies and their associated broadcast identifying information;

storing a list of the valid frequencies and their associated broadcast identifying information in a memory device; and turning off power to the radio receiver if a signal indicating that the motor vehicle has been started has not been received within a predetermined time period since power was applied to the radio receiver.

11. The method of claim 10, where the memory device comprises a volatile memory device.

* * * * *

UNITED STATES PATENT AND TRADEMARK OFFICE
CERTIFICATE OF CORRECTION

PATENT NO. : 7,305,225 B2  Page 1 of 1
APPLICATION NO. : 10/191969
DATED : December 4, 2007
INVENTOR(S) : Benz et al.

It is certified that error appears in the above-identified patent and that said Letters Patent is hereby corrected as shown below:

Column 4
Line 9, delete "includes" and insert --include--

Column 5
Line 41, delete "S4" and insert --24--

Signed and Sealed this

First Day of April, 2008

JON W. DUDAS
*Director of the United States Patent and Trademark Office*